(12) United States Patent
Roba

(10) Patent No.: US 10,839,664 B1
(45) Date of Patent: Nov. 17, 2020

(54) INDEPENDENT AND WEARABLE ELECTRIC SHOCK ALERTING AND PROTECTING DEVICE FOR INDIVIDUALS

(71) Applicant: Falah Yaser Ahmed Roba, Palestinian Authority (IL)

(72) Inventor: Falah Yaser Ahmed Roba, Palestinian Authority (IL)

(*) Notice: Subject to any disclaimer, the term of this patent is extended or adjusted under 35 U.S.C. 154(b) by 0 days.

(21) Appl. No.: 16/871,915

(22) Filed: May 11, 2020

(30) Foreign Application Priority Data

May 30, 2019 (IL) .......................................... 267016

(51) Int. Cl.
G08B 21/02 (2006.01)
G01R 29/24 (2006.01)
G08B 5/36 (2006.01)
H02H 1/00 (2006.01)

(52) U.S. Cl.
CPC ............. *G08B 21/02* (2013.01); *G01R 29/24* (2013.01); *G08B 5/36* (2013.01); *H02H 1/0007* (2013.01)

(58) Field of Classification Search
CPC .......... G08B 21/02; G08B 5/36; G01R 29/24; H02H 1/0007; H02H 3/20; H02J 7/0029; H02J 7/0047; H02J 7/04; G05B 9/02; G05F 3/30
USPC ................................ 340/539.1, 539.11, 573.1
See application file for complete search history.

(56) References Cited

U.S. PATENT DOCUMENTS

| 3,784,842 A | 1/1974 | Kremer |
| 4,175,255 A | 11/1979 | Linnman et al. |
| 9,698,590 B1* | 7/2017 | Mercado ................... H02H 3/20 |
| 2017/0177017 A1* | 6/2017 | Horng ........................ G05F 3/30 |
| 2019/0020191 A1 | 1/2019 | Charneco Fernández et al. |
| 2019/0319449 A1 | 10/2019 | Gegenbauer et al. |

FOREIGN PATENT DOCUMENTS

| CN | 106655112 | 5/2017 |
| CN | 107979068 | 5/2018 |
| DE | 3903025 | 8/1990 |
| EP | 1580860 | 9/2005 |
| ES | 2610031 | 4/2017 |
| WO | 2018104440 | 6/2018 |

* cited by examiner

*Primary Examiner* — Hung T Nguyen
(74) *Attorney, Agent, or Firm* — The Roy Gross Law Firm, LLC; Roy Gross

(57) ABSTRACT

A wearable device designed to operate sets of instructions for protecting individuals from electric shocks. The wearable device comprises a sensor designed to convey a flow of electric charge sensed on a human body. The wearable device also comprises at least one wire configured to accept the flow of electric charge received from the sensor and convey the flow of electric charge to at least one bipolar junction transistor set, wherein the at least one bipolar junction transistor set is connected a power circuit comprising an illumination source connected to a power source, wherein the at least one bipolar junction transistor set is functioning as a switch designed to close the power circuit upon receiving a current of at least 0.1 microampere conveyed from the sensor, and wherein the power source is designed to illuminate the illumination source upon closing the power circuit by the at least one bipolar junction transistor set.

22 Claims, 9 Drawing Sheets

INDEPENDENT AND WEARABLE ELECTRIC SHOCK ALERTING AND PROTECTING DEVICE FOR INDIVIDUALS

FIELD OF THE INVENTION

The present disclosure relates to electric shock alerting and protecting device and method, and more particularly, to personal electrical protection device that disconnects the power circuit in case a person is in touch with the power circuit.

BACKGROUND OF THE INVENTION

Protective devices which protect from a dangerous voltage are today available in forms of ground disconnection devices. These devices comprise the required gear for interrupting the main current when current flows between the power source and ground so as to avoid fire as well as the occurrence of dangerous voltages in grounded equipment. Disconnection devices are also available in designs which protect a person against life-endangering flows of current in case they get simultaneously into contact with a phase and the ground line. One of the main challenges which such dissention devices have, is the sensitivity. In multiple cases, sensing flows of current in the human body may take a second or more, from the moment of the electrocution. In such cases, disconnecting may be after the fact. In some cases, wherein a person is electrocuted, even less than a second count. Furthermore, ground based devices may solve the problem in one location, they may not solve the issue wherein a person is required to roam. In some cases, such devices may require a power source and a physical connection to the power system, in order to function as expected.

SUMMARY OF THE INVENTION

The present invention discloses a method operable on a wearable device designed for protecting individuals from electric shocks. The device disclosed herein comprises a sensor designed to convey a flow of electric charge sensed on a human body. The device can also comprise at least one wire configured to accept the flow of electric charge received from the sensor and convey the flow of electric charge to at least one bipolar junction transistor set, wherein the at least one bipolar junction transistor set is connected a power circuit comprising an illumination source connected to a power source, wherein the at least one bipolar junction transistor set is functioning as a switch designed to close the power circuit upon receiving a current of at least 0.1 microampere conveyed from the sensor, and wherein the power source is designed to illuminate the illumination source upon closing the power circuit by the at least one bipolar junction transistor set.

In some embodiments of the disclosed invention, the disclosed wearable device can be protecting in cases, the person wearing the wearable device is insulated. In some embodiments, the disclosed wearable device can be protecting in cases, the person wearing the wearable device is not insulated, i.e., a person standing on a ground.

The device disclosed herein can also comprise an optocoupler coupled with a transmitter designed to transmit wireless signals, wherein the optocoupler is configured to detect light received from the light illumination, and upon detecting illumination received from the illumination source, activate the transmitter to send predefined signals which indicate that a flow of electric charge sensed on the human body. In some cases, the at least one bipolar junction transistor is a Bipolar NPN transistor. In some cases, the at least one bipolar junction transistor is a Bipolar PNP transistor. The device disclosed herein can also be configured and function as a wearable device. In such cases, the device may be embedded in a strip designed to be wearable by a person.

In some embodiments of the present invention, the predefined signals sent by the transmitter may comprise commands which indicate that a flow of electric charge sensed on the human body. In some cases, the predefined signals can be sent to a receiver, wherein the receiver is connected to a power switch. In such cases, the receiver can be configured and/or designed to disconnect the power switch. In some cases, the optocoupler is functioning as a light dependent resistor. In some embodiments of the present invention, the power source to which the illumination source is connected, can be a battery or batteries. In some cases, the power source to which the illumination source is connected, can be embedded with the device.

The method for protecting individuals from electric shocks disclosed herein can comprise: sensing a flow of electric charge sensed on a human body, by the sensor, and conveying the flow of electric charge to the at least one bipolar junction transistor set. Upon conveying the flow of electric charge to the at least one bipolar junction transistor set, the power circuit may be closed and thereby a flow of electric charge may be allowed to flow from the power source and thereby illuminating the illumination source. Upon illuminating the illumination source, the illumination can be detected by the optocoupler and thereby activating the transmitter by the optocoupler. The method disclosed herein may also comprise a step of sending by the transmitter predefined signals upon activating, wherein the predefined signals indicate that a flow of electric charge sensed on the human body, and wherein the predefined signals are sent to a receiver.

In some cases, the predefined signals sent by the transmitter can comprise commands which indicate that a flow of electric charge sensed on the human body. In some cases, the receiver received the signals may be connected to a power switch. In such cases, the receiver can be configured to disconnect the power switch. In some cases, the optocoupler can be functioning as a light dependent resistor.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DETAILED DESCRIPTION OF THE INVENTION

The present disclosure concerns a device and a method operated thereof for protecting individuals from electric shocks. The device disclosed herein can be configured as a personal electrical protecting and alerting device which disconnects the power circuit in case a person is in touch, or near a power circuit. The disclosed subject matter is based on a sensor designed to convey a flow of electric charge sensed on a human body to a device comprising at least one transistor, and therefrom the device can convey the electric charge flow in order to activate a mechanism designed to disconnect the electric power.

The disclosed subject matter also comprises at least one Bipolar junction transistor which can function as a switch. The Bipolar junction transistor be switched on, with a dependency on current flowing through and/or from the Bipolar junction transistor. The current received and flowing through the Bipolar junction transistor can be conducted by wires. Such wires can be formed of conducting material designed to conduct electric current.

The term "optocoupler" is used herein to depict a component or a set of components configured and designed to transfer electrical signals between two isolated circuits by using light. The optocoupler can also prevent high voltages from affecting the system receiving the signal. In some embodiments of the present invention, the optocoupler, also known as an optical-isolator, and/or optocoupler can be a c (LDR).

Figure 1A:
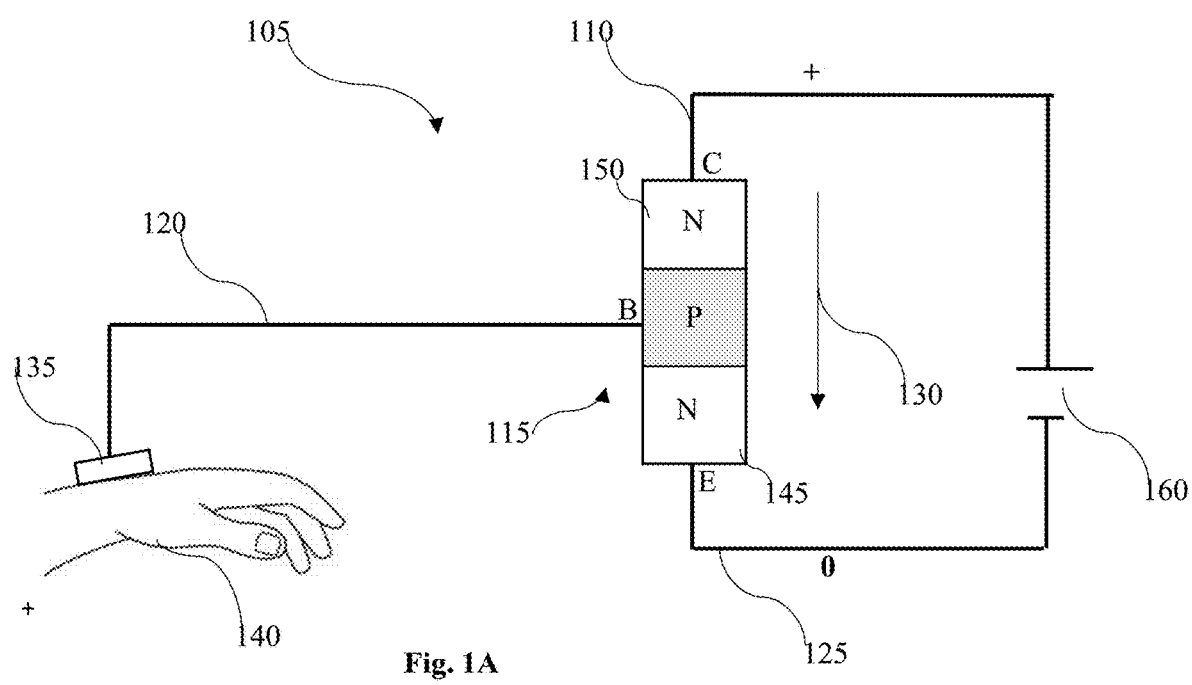
FIG. 1A shows a system comprising a sensor and a Bipolar NPN transistor designed to receive a low level of electric charge flow and use the electric charge flow to close an electric circuit, according to the disclosed subject matter.

The term "wireless connection" or "wireless frequency" is used herein to depict a wireless oscillation rate of an alternating electric current or voltage or of a magnetic, electric or electromagnetic field or mechanical system. In some embodiments of the present invention, the frequency range of the wireless connection can be Radio Frequency at the Radio spectrum. In possible embodiments of the present invention, the wireless connection frequency may be in a different spectrum of the Radio spectrum. For example, the wireless connection can be at the spectrum of the Wi-Fi spectrum. In some other cases, other technologies for generating wireless connection may be utilized. For example, the other technologies can be such as, Infra-Read technology, Bluetooth technology, and the like. FIG. 1A shows a system comprising a sensor and a Bipolar NPN transistor designed to receive a low level of electric charge flow and use the electric charge flow to close an electric circuit, according to the disclosed subject matter. FIG. 1A shows a system 105 comprising a sensor 135 designed to be attached to a human body. Sensor 135 is attached to hand 140 and configured to sense a low level of electric current which flows on the human body. In some cases, sensor 135 may be configured to be attached to other parts of the human body. The part to which the sensor 135 can be attached can be legs, stomach, chest, arms, back and the like.

The sensor 135 is also designed to convey the electric current from the human body, via a wire 120 to a Bipolar NPN transistor 115, wherein wire 120 is configured to conduct the electric current through the Base of the Bipolar NPN transistor 115. In some cases, the sensor 135 may be configured to sense electric current at the level of essential of 0.1 microampere. In some cases, the sensor 135 may be configured to sense and convey electric voltage at the level of at least 0.7 volts.

The Bipolar NPN transistor 115 comprises a collector 150 and an emitter 145. The collector 150 is also connected to a power circuit with a power source 160 via a wire 110 designed to conduct the positive charge. In some cases, the power source 160 can be a battery. The emitter 145 is also connected to the power circuit with a power source 160 via wire 125 configured to convey zero volts. Thus, in case the Base of the Bipolar NPN transistor 115 which is connected to wire 125 forwards current which is biased by more than 0.7 volts, a current can flow from the emitter 145 to the collector 150 and the Bipolar NPN transistor 115 is set to be switched "ON". In such embodiments of the disclosed subject matter, the Bipolar NPN transistor 115 operates as a switch. In case the Bipolar NPN transistor 115 is set to be switched "ON", electric current can flow from the wire 110 to the wire 125, according to the direction shown by a first arrow 130. The movement of negative current through the Base constitutes transistor action of the Bipolar NPN transistor 115. In such case wherein the Bipolar NPN transistor 115 is activated, mobile electrons provide the link between the Emitter 145 and the Collector 150.

In some cases, the semiconductor material of the Bipolar NPN transistor 115 can be Silicon. In such cases, a minimal biasing of 0.7 volts may activate the Bipolar NPN transistor 115 and set the Bipolar NPN transistor 115 to be switched "ON". In some cases, the semiconductor material of the Bipolar NPN transistor 115 can be Germanium. In such cases, a minimal biasing of 0.3 volts may activate the Bipolar NPN transistor 115 and set the Bipolar NPN transistor 115 to be switched "ON".

Figure 1B:
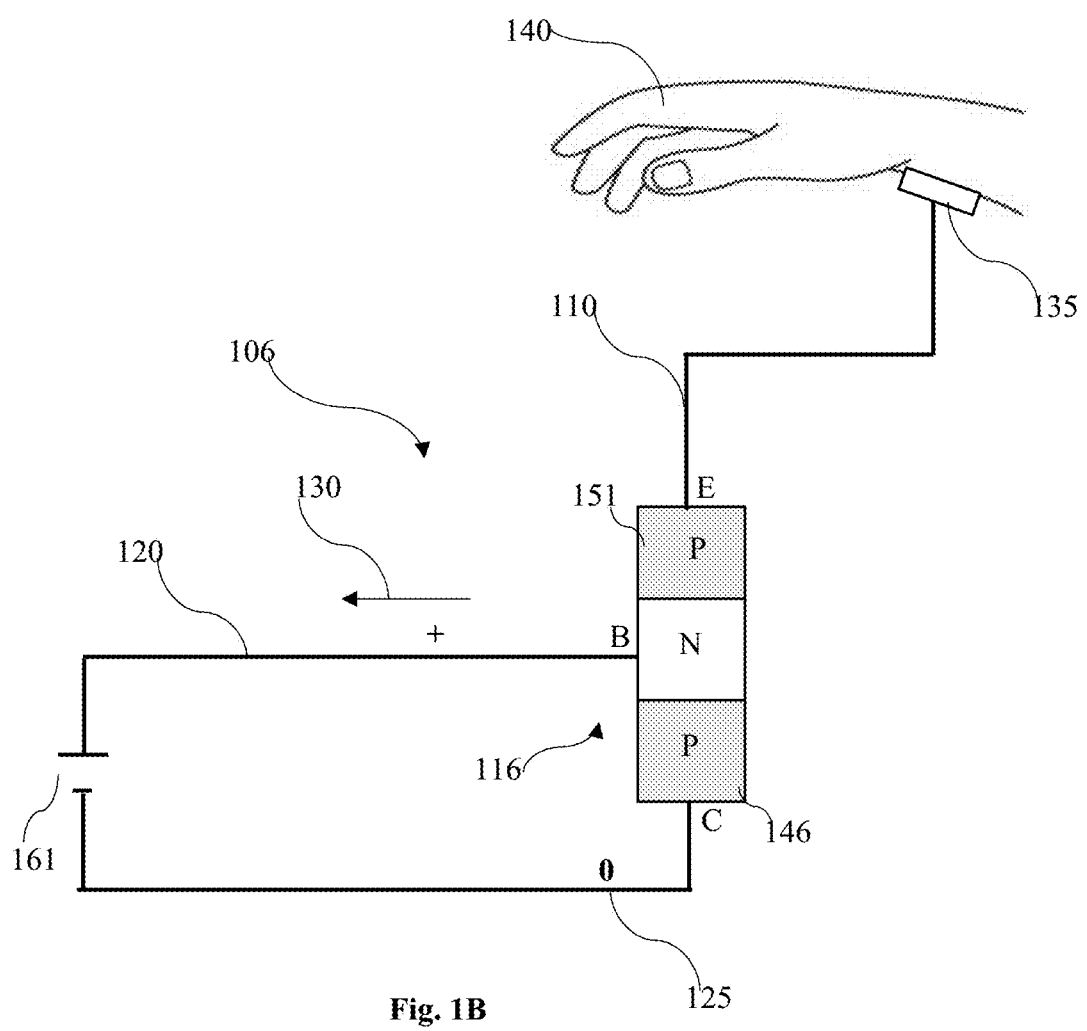
FIG. 1B shows a system comprising a sensor and a Bipolar PNP transistor designed to receive a low level of electric charge flow and use the electric charge flow to close an electric circuit, according to the disclosed subject matter.

FIG. 1B shows a system comprising a sensor and a Bipolar PNP transistor designed to receive a low level of electric charge flow and use the electric charge flow to close an electric circuit, according to the disclosed subject matter. FIG. 1B shows a system 106 comprising a sensor 135 designed to be attached to a human body. Sensor 135 is attached to hand 140 and configured to sense a low level of electric current which flows on the human body. In some cases, sensor 135 can be configured to be attached to other parts of the human body. The part to which the sensor 135 can be attached can be legs, stomach, chest, arms, back and the like.

The sensor 135 is also designed to convey the electric current from the human body, via a wire 110 to a Bipolar PNP transistor 116, wherein wire 110 is designed to conduct the electric current through the emitter 151 of the Bipolar PNP transistor 116. In some cases, the sensor 135 may be configured to sense electric current at the level of essential of 0.1 microampere. In some cases, the sensor 135 may be configured to sense and convey electric voltage at the level of at least 0.7 volts. In other some cases, the sensor 135 may be configured to sense and convey electric voltage at the level of at least 0.3 volts.

The Bipolar PNP transistor 116 comprise a collector 146 and an emitter 151. The collector 146 is also connected to a power circuit with a power source 161 via a wire 125. In some cases, the power source 161 can be a battery. The emitter 151 is also connected to a wire 110 configured to convey positive charge. Thus, in case the emitter 151 connected to wire 110 is forward biased by more than 0.7 volts, a current will flow from the emitter 151 to the base connected to wire 120, and the Bipolar PNP transistor 116 is said to be switched "ON". When operated in this mode, the Bipolar PNP transistor 116 operates as a switch. Thus, in case the Bipolar PNP transistor 116 is switched "ON", electric current can flow from wire 120 to wire 125, according to the direction shown by a first arrow 130, wherein the power is powered by the power source 161. In such embodiments of the disclosed subject matter, the Bipolar PNP transistor 116 can allow electron current to flow out of the base and collector towards a power circuit with a power source 161.

In some cases, the semiconductor material of the Bipolar PNP transistor 116 can be Silicon. In such cases, a minimal biasing of 0.7 volts may activate the Bipolar PNP transistor 116 and set the Bipolar PNP transistor 116 to be switched "ON". In some cases, the semiconductor material of the Bipolar PNP transistor 116 can be Germanium. In such cases, a minimal biasing of 0.3 volts may activate the Bipolar PNP transistor 116 and set the Bipolar PNP transistor 116 to be switched "ON".

Figure 2:
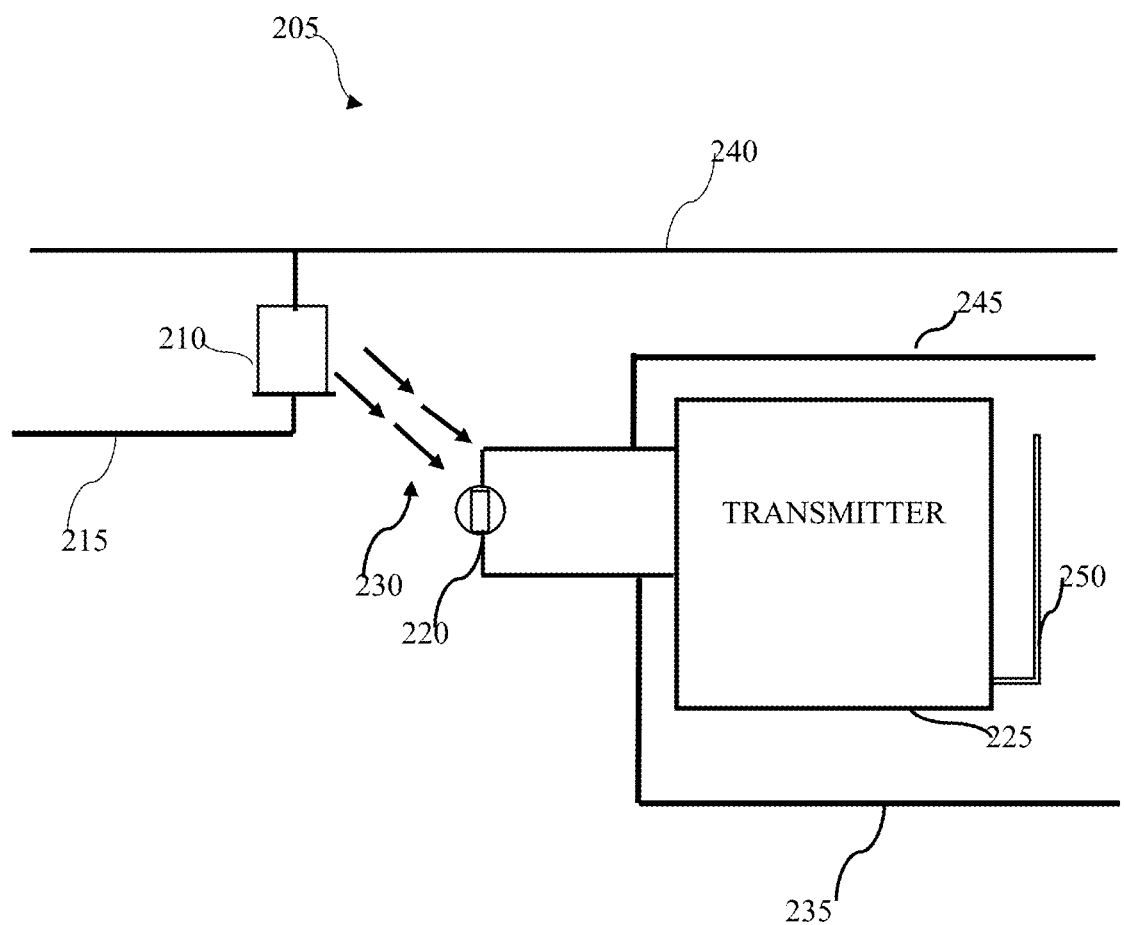
FIG. 2 shows a transmitter coupled with a light dependent resistor configured to transmit electric signals relative to the light level illuminated by an illumination source, according to exemplary embodiments of the present invention.

FIG. 2 shows a transmitter coupled with a light dependent resistor configured to transmit electric signals relative to the light level illuminated by an illumination source, according to exemplary embodiments of the present invention. FIG. 2 shows a system 205 comprises an illumination source 210. In some cases, the illumination source 210 can optionally be discrete illuminators and may include a light-emitting diode (LED), which may be a white light LED, an infrared light LED, a near infrared light LED, an ultraviolet light LED or any other LED and or combination of the same. The illumination source 210 can be connected to an electric source provided by wire 240 and wire 215. In such cases, the illumination source 210 can be configured to illuminate in case electric current flows in a circuit comprising the wire 215 and wire 240.

The system 205 also comprises a transmitter coupled with an optocoupler 220. In some cases, the optocoupler 220 is designed with high electric resistance, i.e., 1,000,000 ohms. Such an electric resistance may prevent from electric charges to flow from wire 245 to wire 235, which are connected to the optocoupler 220. The optocoupler 220 is also designed to detect light, as shown in arrow set 230, and reduce the electric resistance with dependency on the level of the detected light. For example, an electric current cannot flow from wire 245 to wire 235, or vice versa, due to the electric resistance of the optocoupler 220. In case the optocoupler 220 can be configured to detect light illuminated by the illumination source 210, the electric resistance decreases, and electric charges can flow from wire 245 to wire 235, or vice versa.

In some cases, the electric current flows from wire 245 to wire 235, or vice versa, may activate the transmitter 225. In some cases, the transmitter 225 is configured to generate a wireless frequency alternating current, which is applied to an antenna 250. In some cases, the antenna 250 is designed to receive the alternating current and generate therefrom wireless connection. In some cases, wireless connection can be sent to a remote power switch (not shown) designed to receive the wireless connection and disconnected the electric current, upon receiving the wireless connection. In some cases, the wireless connection may comprise a specific message or information to the power switch. Such an information can be the location of the transmitter 225, the time of issuing the message, and the like. In some cases, the transmitter 225 may communicate with a receiver designed to manage the power switch.

Figure 3:
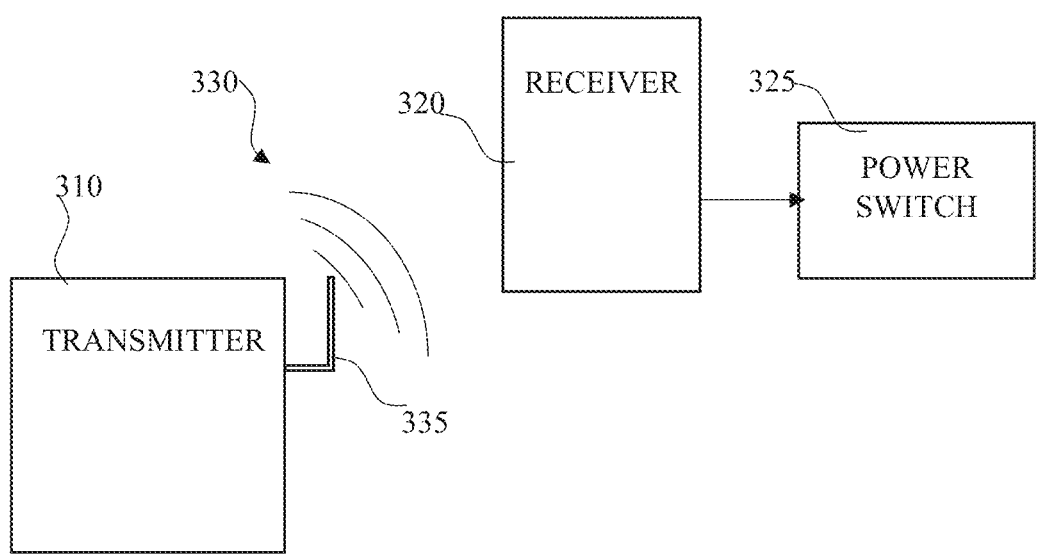
FIG. 3 shows a transmitter communicating with a receiver coupled to a power switch, according to exemplary embodiments of the disclosed subject matter.

FIG. 3 shows a transmitter communicating with a receiver coupled to a power switch, according to exemplary embodiments of the disclosed subject matter. FIG. 3 shows a transmitter 310. The transmitter 310 can be designed to communicate the wireless connection to the receiver 320, via wireless connection 330. In such cases, the transmitter 310 may be configured and designed to send predefined signals for the receiver 320, via wireless frequency which can be applied by an antenna 335. In such cases, the sent predefine signals can indicate that a flow of electric charge sensed on the human body. The predefined signals may encode one or more commands addressed to the power switch 325, for the purpose of disconnecting the power. In some other cases, the predefined signals carried out by the wireless connection may comprise a specific message or information to the power switch. Such an information can be the location of the transmitter 310, the time of issuing the message, and the like.

The power switch 325 can be configured to disconnect the electric power, upon receiving a signal or a power disconnect command. In some cases, the power switch 325 may be configured to disconnect the entire area or location, wherein the electric shock where reported. For example, in case an electric shock the power disconnect command is sent from a person within a building, the power switch 325 can disconnect the power supply to this specific building from which the power disconnect command was sent. In some cases, the power switch 325 may be configured to disconnect the power of multiple areas or buildings. Thus, the power switch 325 can be configured to disconnect the power of a specific area building, upon receiving the power disconnect command associated with said specific location or specific building.

Figure 4:
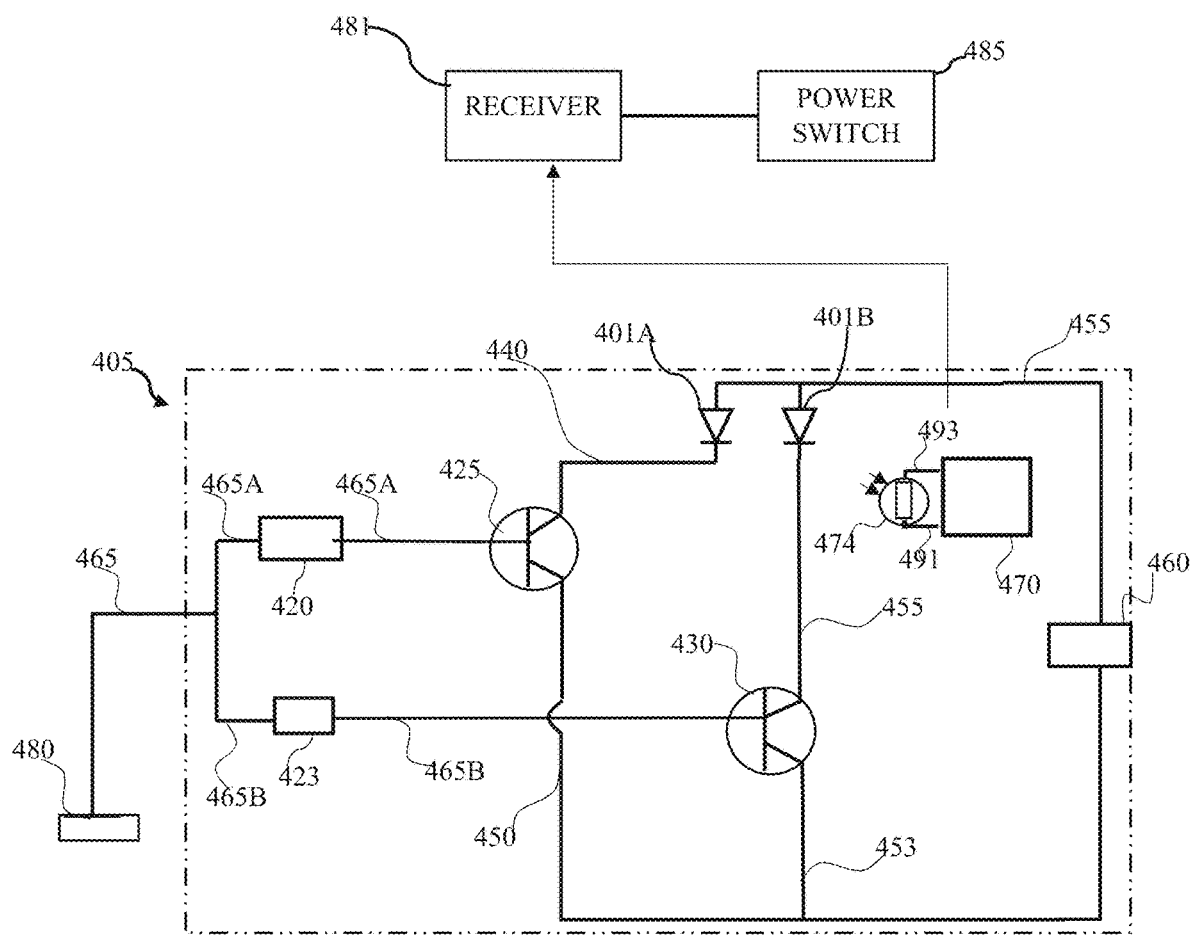
FIG. 4 discloses setting of a device designed for protecting individuals from electric shocks, according to exemplary embodiments of the disclosed subject matter.

FIG. 4 discloses setting of a device designed for protecting individuals from electric shocks, according to exemplary embodiments of the disclosed subject matter. FIG. 4 shows a setting of a device 405 designed for protecting and/or alerting individuals from electric shocks on a person. The device 405 can be connected to a sensor 480 designed to be attached to a human body, as aforementioned. In some cases, the device 405 and the sensor 480 can be coupled together and placed in a wearable device designed to be carried on by a person. For example, the sensor 480 can be configured to be attached to parts of the human body. The part to which the sensor 480 can be attached can be legs, stomach, chest, arms, back and the like. The device 405 can also be designed to be carried by a person. In some cases, the sensor 480 and the device 405 may be coupled and configured to carried together by a person.

The sensor 480 is designed to convey a flow of electric charge sensed on a human body, via a wire 465 to the device 405. The device can convey the electric charge flow in order to operate a power switch designed to disconnect the electric power, upon receiving a power disconnect command. The device 405 comprises two wires, wire 465A and wire 465B configured to accept the flow of electric charge received from the wire 465. Wire 465A can be coupled with a resistor 420 designed to provide resistance to current in wire 465A. In some cases, the resistor 420 can characterized by essentially 2200 Ohms. Wire 465B can also be coupled with a resistor 423, which designed to provide resistance to current in wire 465A. In some cases, the resistor 420 can characterized by essentially 2200 Ohms.

The device 405 can comprise a first Bipolar junction transistor set 425 connected to wire 465A. In some cases, the first Bipolar junction transistor set 425 can comprise one Bipolar junction transistor. In some other cases, the first Bipolar junction transistor set 425 can comprise at least two Bipolar NPN junction transistors coupled to each other. In some other cases, the first Bipolar junction transistor set 425 can comprise at least two Bipolar PNP junction transistors coupled to each other. For example, the first Bipolar junction transistor set 425 can comprise two, or three, or more Bipolar junction transistors. In some cases, the first Bipolar junction transistor set 425 can be configured as a Darlington pair comprising two transistors which act as a single transistor but with a higher current gain.

The first Bipolar junction transistor set 425 can accept the electric charge flow conveyed by the wire 465A. In some cases, the first Bipolar junction transistor set 425 can comprise a Bipolar NPN transistor. In such case, the wire 465A can be connected to the Base of the Bipolar NPN transistor, the emitter of the Bipolar NPN transistor can be connected to a first wire 440, and the collector of the Bipolar NPN transistor can be connected to a second wire 450. Thus, current which is biased by more than 0.7 volts and conducted through the Base of the Bipolar NPN transistor can flow from the emitter connected to the first wire 440 to the collector connected to the second wire 450, and thereby close a circuit and allow the power source 460 to power the illumination source 401A. In some cases, the illumination source 401A may optionally be discrete illuminators and may include a light-emitting diode (LED), as aforementioned.

In some embodiments of the disclosed subject matter, the first Bipolar junction transistor set 425 may comprise more than one Bipolar NPN transistor. For example, the first Bipolar junction transistor set 425 can comprise a pair of Bipolar NPN transistors, wherein the collector one Bipolar NPN transistor is connected to the Base of the other Bipolar NPN transistor, i.e., an NPN Darlington pair. In some cases, more than two (2) Bipolar NPN transistors which may be concatenated one to another.

In some embodiments of the disclosed subject matter, the first Bipolar junction transistor set 425 can comprise a Bipolar PNP transistor. In such case, the wire 465A can be connected to the emitter of the Bipolar PNP transistor, the Base of the Bipolar PNP transistor can be connected to the first wire 440, and the collector of the Bipolar PNP transistor can be connected to the second wire 450. Thus, current which is biased by more than 0.7 volts and conducted through the emitter of the Bipolar PNP transistor can flow from the Base connected to the first wire 440 to the collector connected to the second wire 450, and thereby close a circuit and allow the power source 460 to power the illumination source 401A.

In some embodiments of the disclosed subject matter, the first Bipolar junction transistor set 425 may comprise more than one Bipolar PNP transistor. For example, the first Bipolar junction transistor set 425 can comprise a pair of Bipolar PNP transistors, wherein the Base one Bipolar PNP transistor is connected to the emitter of the other Bipolar PNP transistor. In some cases, more than two (2) Bipolar PNP transistors which may be concatenated one to another.

Thus, according to possible embodiments of the present invention, the first Bipolar junction transistor set 425 can be connected to a power circuit, comprising the illumination source 401A connected to the power source 460, and the first wire 440 designed to convey a flow of electric charge via the first Bipolar junction transistor set 425 to the second wire 450 to close the power circuit, wherein the first Bipolar junction transistor set 425 is functioning as a switch allowing electric charge to flow from the first wire 440 to the second wire 450 upon receiving a current of at least 0.1 microampere from wire 465A.

In some embodiments of the disclosed subject matter, the device 405 can also comprise a second Bipolar junction transistor set 430 connected to wire 465B and thereby receive power conveyed from the power source 460. In some cases, the second Bipolar junction transistor set 430 can comprise one Bipolar junction transistor. In some other cases, the Bipolar junction transistor set 430 can comprise more than one Bipolar junction transistor coupled to each other. For example, the second Bipolar junction transistor set 430 can comprise two, or three, or more Bipolar junction transistors coupled to each other as aforementioned. In some cases, the second Bipolar junction transistor set 430 can be configured as a Darlington pair comprising two transistors which act as a single transistor but with a higher current gain.

The second Bipolar junction transistor set 430 can accept the electric charge flow conveyed by the wire 465B. In some cases, the second Bipolar junction transistor set 430 can comprise a Bipolar NPN transistor. In such case, the wire 465B can be connected to the Base of the Bipolar NPN transistor, the emitter of the Bipolar NPN transistor can be connected to a third wire 455, and the collector of the Bipolar NPN transistor can be connected to a fourth wire 453. Thus, current which is biased by more than 0.7 volts and conducted through the Base of the Bipolar NPN transistor can flow from the emitter connected to the third wire 455 to the collector connected to the fourth wire 453, and thereby close a circuit and allow the power source 460 to power the illumination source 401B. In some cases, the illumination source 401B may optionally be discrete illuminators and may include a light-emitting diode (LED), as aforementioned.

In some embodiments of the disclosed subject matter, the second Bipolar junction transistor set 430 may comprise more than one Bipolar NPN transistor. For example, the second Bipolar junction transistor set 430 can comprise a pair of Bipolar NPN transistors, wherein the collector one Bipolar NPN transistor is connected to the Base of the other Bipolar NPN transistor, i.e., an NPN Darlington pair. In some cases, more than two (2) Bipolar NPN transistors which may be concatenated one to another.

In some embodiments of the disclosed subject matter, the second Bipolar junction transistor set 430 can comprise a Bipolar PNP transistor. In such case, the wire 465B can be connected to the emitter of the Bipolar PNP transistor, the Base of the Bipolar PNP transistor can be connected to the third wire 455, and the collector of the Bipolar PNP transistor can be connected to the fourth wire 453. Thus, current which is biased by more than 0.7 volts and conducted through the emitter of the Bipolar PNP transistor can flow from the Base connected to the third wire 455 to the collector connected to the fourth wire 453, and thereby close a circuit and allow the power source 460 to power the illumination source 401B.

In some embodiments of the disclosed subject matter, the second Bipolar junction transistor set 430 may comprise more than one Bipolar PNP transistor. For example, the second Bipolar junction transistor set 430 can comprise a pair of Bipolar PNP transistors, wherein the Base one Bipolar PNP transistor is connected to the emitter of the other Bipolar PNP transistor. In some cases, more than two (2) Bipolar PNP transistors which may be concatenated one to another.

The device 405 also comprises a transmitter 470 coupled with an optocoupler, i.e., light dependent resistor (LDR), denoted as optocoupler 474. In some cases, the transmitter 470 can be connected to power source (not shown). In some other cases, the transmitter 470 can be connected to the power source 460. The optocoupler 474 is designed with high electric resistance, i.e., 1,000,000 ohms. Such an electric resistance may prevent from electric charges to flow from wire 493 to wire 491, which are connected to the optocoupler 474. The optocoupler 474 is also designed to detect light and reduce the electric resistance in dependence with the level of the detected light. For example, an electric current cannot flow from wire 493 to wire 491, or vice versa, due to the electric resistance of the optocoupler 474. In case the optocoupler 474 detects light illuminated by an illumination source 410A and/or by an illumination source 410B, the electric resistance decreases, and electric charges can flow from wire 493 to wire 491, or vice versa.

In some cases, the electric current flows from wire 493 to wire 491, or vice versa, may activate the transmitter 470. In some cases, the transmitter 470 is configured to generate a wireless frequency alternating current, which is applied to an antenna (not shown), as aforementioned and thereby send messages to the remote power switch 485. In some cases, messages sent to a remote power switch 485 comprise commands for disconnecting the electric current, upon receiving the messages. In such cases, the sent commands can indicate that a flow of electric charge sensed on the human body. In some cases, the wireless connection can be sent to a remote receiver 481. The remote receiver 481 can be configured to communicate with the remote power switch 485 and send thereto the messages sent from the transmitter 470. In some cases, the messages may comprise a specific message or information to the power switch. Such an information can be the location of the transmitter 470, the time of issuing the message, and the like.

Thus, according to possible embodiments of the present invention, the second Bipolar junction transistor set 430 can be connected to a power circuit, comprising the illumination source 401B connected to the power source 460, and the third wire 455 designed to convey a flow of electric charge via the second Bipolar junction transistor set 430 to the fourth wire 453 to close the power circuit, wherein the second Bipolar junction transistor set 430 is functioning as a switch allowing electric charge to flow from the third wire 455 to the fourth wire 453 upon receiving a current of at least 0.1 microampere from wire 465B.

In some embodiments of the disclosed subject matter, the device 405 can comprise one Bipolar junction transistor set such as first Bipolar junction transistor set 425, or second Bipolar junction transistor set 430. In such cases, the device 405 may also comprise one illumination source such as illumination source 401A for operating the optocoupler 474 and thereby activate the transmitter 470. In possible embodiments of the disclosed subject matter, the device 405 can comprise more than two Bipolar junction transistor sets such as first Bipolar junction transistor set 425, or second Bipolar junction transistor set 430. In such cases, the device 405 may also comprise more than two illumination sources for operating the optocoupler 474, such as illumination source 401A and illumination source 401B, for activating the transmitter 470.

Figure 5:
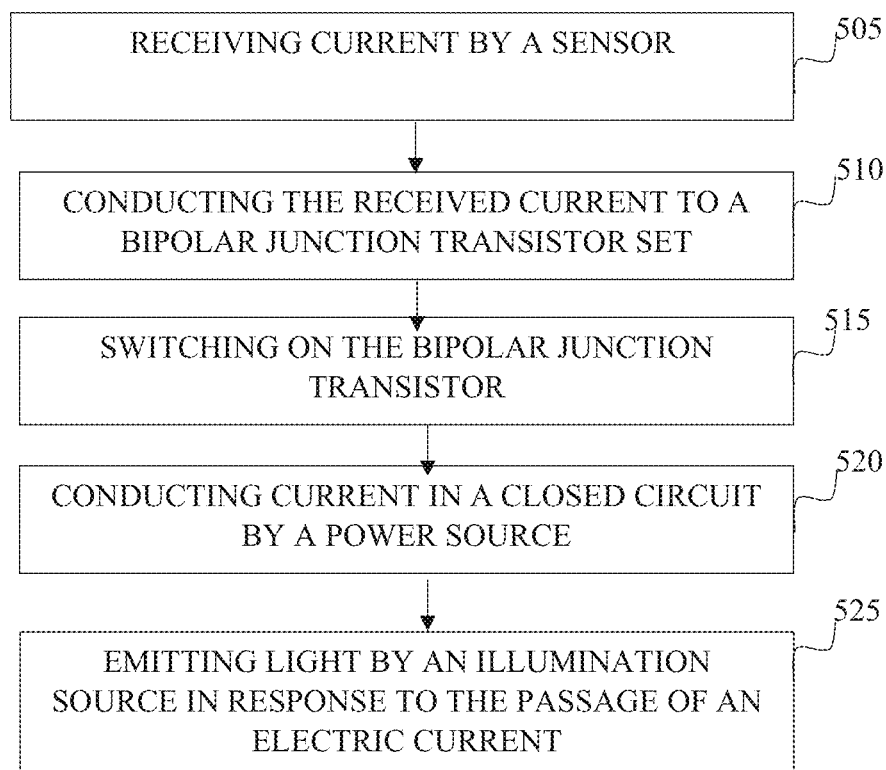
FIG. 5 discloses a method for utilizing a Bipolar junction transistor as a switch upon receiving electrical current from a sensor, according to exemplary embodiments of the disclosed subject matter.

FIG. 5 discloses a method for utilizing a Bipolar junction transistor as a switch upon receiving electrical current from a sensor, according to exemplary embodiments of the disclosed subject matter. At step 505 a wearable device designed to detect and alert an electric shock in human body. In some cases, such a device can be wearable on a human body. The current received by the device can be form a sensor configured to be attached to parts of the human body. The part to which the sensor can be attached can be legs, stomach, chest, arms, back and the like. In some cases, such a current may be at least 0.1 microampere, or electric voltage at the level of at least 0.7 volts. In some cases, such a current may be characterized by electric voltage at the level of at least 0.3 volts.

At step 510 the device received the electric current, may conduct the received current to a Bipolar junction transistor set connected to a power source, i.e., battery. The Bipolar junction transistor set can comprise at least one Bipolar junction transistor which can be configured to receive a low level of electric charge flow and use the electric charge flow to close an electric circuit. In some cases, the at least one Bipolar junction transistor may be more than one Bipolar junction transistor concatenated one to another, i.e., such as in a Darlington pair. In some cases, the at least one Bipolar junction transistor may be Bipolar NPN transistor, or Bipolar NPN transistors. In some other cases, the at least one Bipolar junction transistor may be Bipolar PNP transistor, or Bipolar PNP transistors. In some embodiments of the disclosed subject matter, the at least one Bipolar junction transistor can comprise a at least one Bipolar NPN transistor. In some cases, the Bipolar junction transistor set may comprise two Bipolar NPN transistors. Such Bipolar NPN transistors can amplify the electric current flow to the Base of the Bipolar NPN transistors. For example, in case a Darlington pair is utilized, the current can flow through the base of one Bipolar NPN transistor, and the then through the Base of the second Bipolar NPN transistor. In such a case, the Bipolar NPN transistors may function as a switch and also as an amplifier for the current. In some cases, the Bipolar junction transistor set may comprise two Bipolar PNP transistors, as aforementioned. In such cases, the Bipolar PNP transistors may function as a switch and also as an amplifier for the current.

At step 515 the Bipolar junction transistor set can be switched "ON" as a result of the current received by the device. Said switched "ON" can close a circuit connected to the Bipolar junction transistor set. At step 520 the Bipolar junction transistor set can allow the current to flow via the Bipolar junction transistor set from the power source connected to the Bipolar junction transistor set in a closed circuit. In some cases, wherein the Bipolar junction transistor set comprises more than one Bipolar junction transistor, the current can flow in a close circuit power by the power source connected to the Bipolar junction transistor set. In some cases, the close circuit connected the power source to the Bipolar junction transistor set may also comprise an illumination source, designed to illuminate as a result of a current flowing in the close circuit. In some cases, the illumination source may optionally be discrete illuminators and may include a light-emitting diode (LED), as aforementioned. At step 525 light can be emitted from the illumination source in response to the passage of the electric current flowing in the close circuit.

Figure 6:
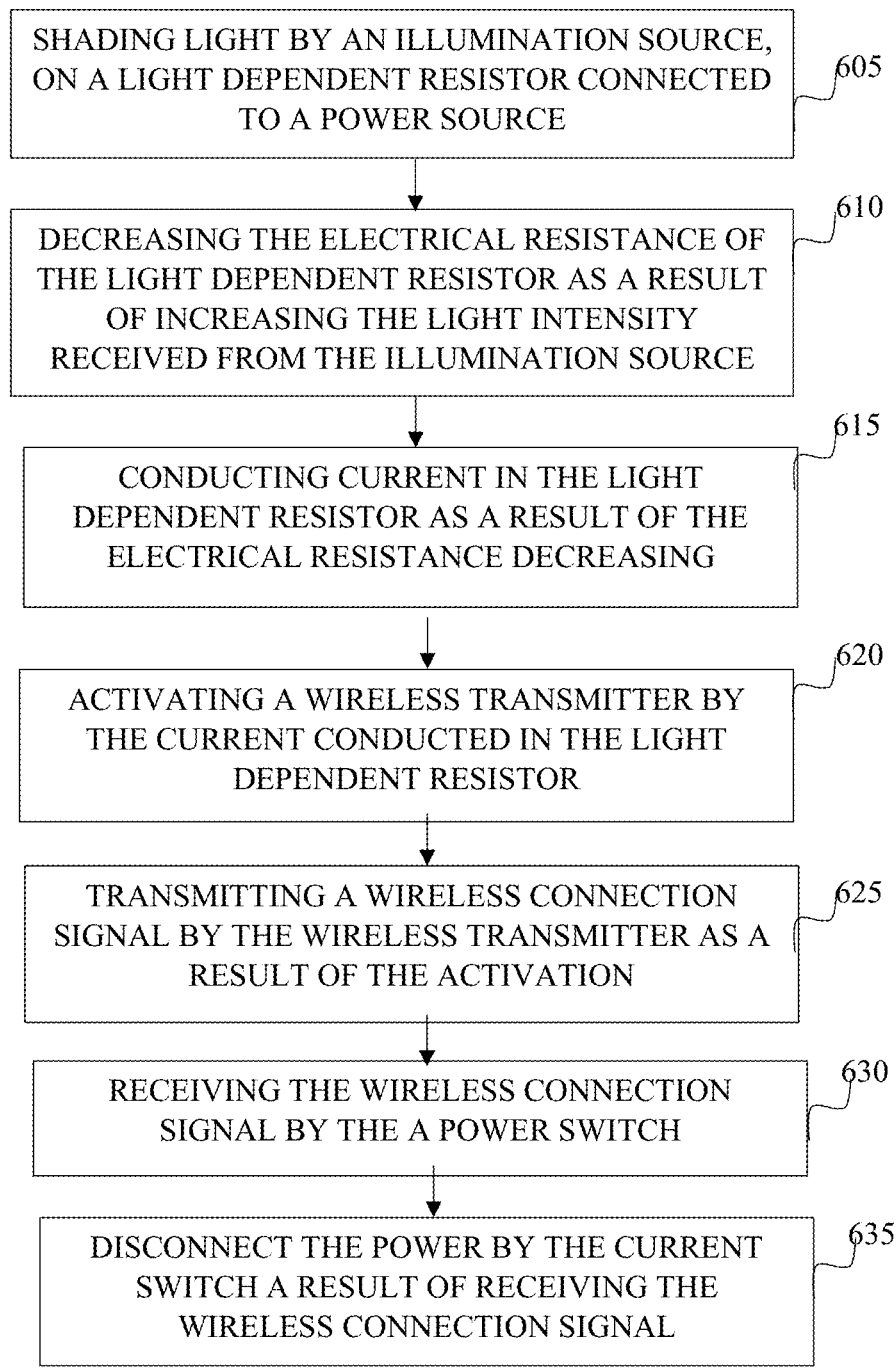
FIG. 6 discloses a method for utilizing an illumination source and a light dependent resistor to produce an alert for electric shock, according to exemplary embodiments of the disclosed subject matter.

FIG. 6 discloses a method for utilizing a illumination source and a light dependent resistor to produce an alert for electric shock, according to exemplary embodiments of the disclosed subject matter. At step 605 an optocoupler (light dependent resistor) connected to a power source receives a light illuminated by an illumination source. Such an illumination source can optionally be discrete illuminators and may include a light-emitting diode (LED), as aforementioned. The LDR can be configured with a wearable device designed to detect and alert an electric shock in human body. In some cases, such a device can be wearable on a human body. The current received by the device can be form a sensor configured to be attached to parts of the human body. The part to which the sensor can be attached can be legs, stomach, chest, arms, back and the like. The optocoupler can also be connected to a wireless transmitter designed to receive electric current and transmit an alert to a remote receiver or a remote switch, as aforementioned. The remote receiver or a remote switch can be designed to receive such alerts and disconnect the electric power upon receiving such an alert.

At step 610 the optocoupler decreases the electrical resistance as a result of increasing the light intensity received from the illumination source. At step 615 the optocoupler can allow the current to flow as a result of the electrical resistance decreasing. At step 620 the current flowing through the optocoupler can activate the wireless transmitter connected to the optocoupler. At step 625 the wireless transmitter can transmit a wireless connection signal as a result of the activation. The wireless transmitter can be connected to a power source, i.e., the power source of the wearable device. At step 630 the power switch receives the signal transmitted by the wireless transmitter. In some cases, a remote receiver can receive the signal and then, transmit the signal further to the power switch. At step 635 the power switch disconnects the power. In some cases, the power switch can be a switch designed to turn the current off. For example, in a building wherein such a power switch can be configured to power off the current supplied to the building. In some cases, such a power switch can be connected to the power source of the building, i.e., the power received form the power grid. Another exemplary case can be a power switch configured to disconnect the power from a specific room. In such cases, the power switch may be connected to power source which supplies the specific room, and upon receiving a signal, disconnect the power form the room.

Figure 7:
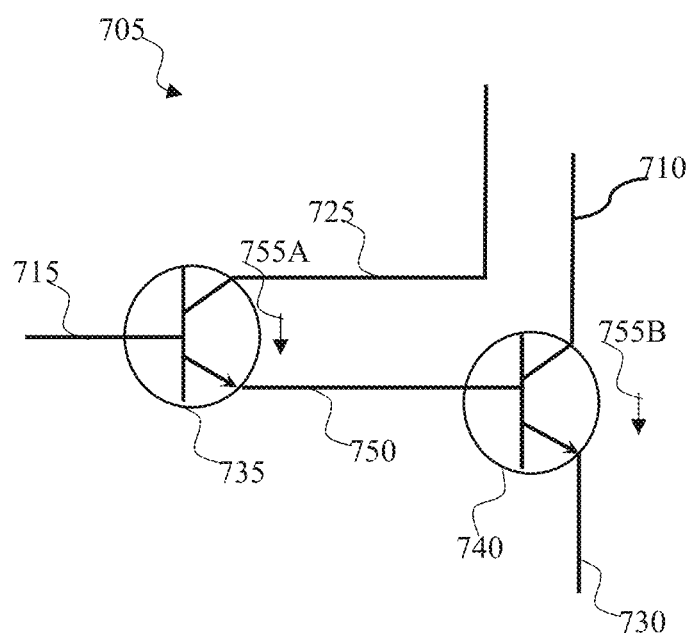
FIG. 7 shows a Bipolar junction transistor set which comprises two Bipolar NPN transistors configured to function as switch, according to exemplary embodiments of the present invention.

FIG. 7 shows a Bipolar junction transistor set which comprises two Bipolar NPN transistors configured to function as switch, according to exemplary embodiments of the present invention. FIG. 7 a Bipolar junction transistor set 705. The Bipolar junction transistor set 705 comprises a Bipolar NPN transistor 735 configured to receive current from wire 715. The wire 715 configured to conduct the electric current through the Base of the Bipolar NPN transistor 735. In some cases, the current can be at the level of essential of 0.1 microampere. In some case, the electric voltage at the level of at least 0.7 volts. In some other case, the electric voltage at the level of at least 0.3 volts.

The Bipolar NPN transistor 735 is configured to forward current which is biased by more than 0.7 volts or 0.3 and thereby allow the Bipolar NPN transistor 735 to be switched "ON". In such embodiments of the disclosed subject matter, the Bipolar NPN transistor 735 operates as a switch. In case the Bipolar NPN transistor 735 is switched "ON", electric current can flow from wire 725 to wire 750, according to the direction shown by a first arrow 755A.

In some cases, the semiconductor material of the Bipolar NPN transistor 735 can be Silicon. In such cases, a minimal biasing of 0.7 volts may activate the Bipolar NPN transistor 735 and set the Bipolar NPN transistor 735 to be switched "ON". In some cases, the semiconductor material of the Bipolar NPN transistor 735 can be Germanium. In such cases, a minimal biasing of 0.3 volts may activate the Bipolar NPN transistor 735 and set the Bipolar NPN transistor 735 to be switched "ON".

The Bipolar junction transistor set 705 also comprises a Bipolar NPN transistor 740 configured to receive current from wire 750. The wire 750 is configured to conduct the electric current from the collector of the Bipolar NPN transistor 735 through the Base of the Bipolar NPN transistor 740. In some cases, the current can be at the level of essential of 0.1 microampere. In some case, the electric voltage at the level of at least 0.7 volts. In some other case, the electric voltage at the level of at least 0.3 volts.

The Bipolar NPN transistor 740 is configured to forward current which is biased by more than 0.7 volts or 0.3 and thereby allow the Bipolar NPN transistor 740 to be switched "ON". In such embodiments of the disclosed subject matter, the Bipolar NPN transistor 740 operates as a switch. In case the Bipolar NPN transistor 740 is switched "ON", electric current can flow from wire 710 to wire 730, according to the direction shown by a second arrow 755B.

In some cases, the semiconductor material of the Bipolar NPN transistor 740 can be Silicon. In such cases, a minimal biasing of 0.7 volts may activate the Bipolar NPN transistor 740 and set the Bipolar NPN transistor 740 to be switched "ON". In some cases, the semiconductor material of the Bipolar NPN transistor 740 can be Germanium. In such cases, a minimal biasing of 0.3 volts may activate the Bipolar NPN transistor 740 and set the Bipolar NPN transistor 740 to be switched "ON". In some cases, the Bipolar junction transistor set 705 may be utilized as a Bipolar junction transistor set for a device designed to protect and alert electric shocks, as aforementioned.

Figure 8:
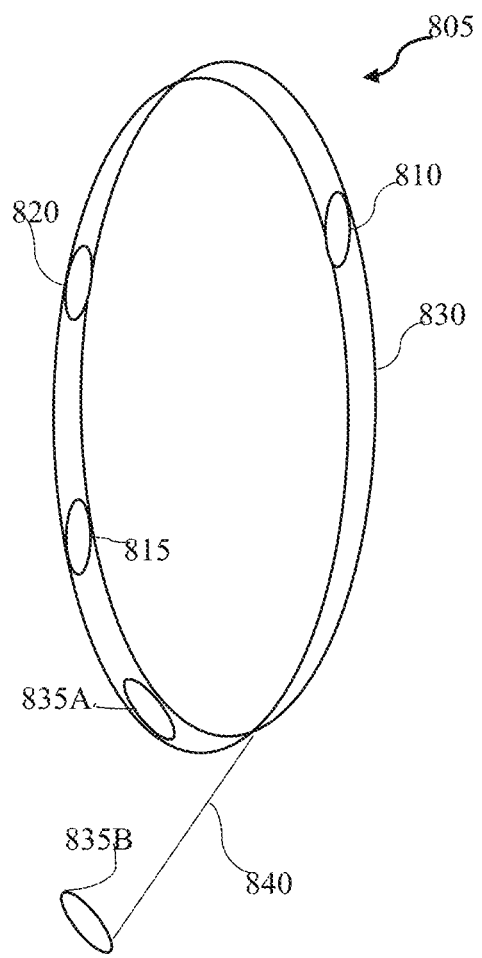
FIG. 8 shows a wearable device for protecting and alerting electric shock on a person, according to exemplary embodiments of the disclosed subject matter.

FIG. 8 shows a wearable device for protecting and alerting electric shock on a person, according to exemplary embodiments of the disclosed subject matter. FIG. 8 shows a wearable device 805 protecting and/or alerting individuals from electric shock on a person. The wearable device 805 comprises a strip 830 designed to be wearable by a person. The strip 830 can be such as a band, belt, bracelet and the like. In some cases, the strip 830 can be wearable on parts of the human body. The human part to which the strip 830 can be such as legs, wrist, and the like. In some embodiments of the discloses subject matter, the wearable device 805 can be connected to a sensor 835A designed to convey a flow of electric charge sensed on a human body, as aforementioned. The sensor 835A can be embedded in the strip 830. The current received by the device can be form a sensor 835A configured to be attached to parts of the human body. In other possible embodiments of the discloses subject matter, the wearable device 805 can be connected via wire 840 to a sensor 835B for receiving electrical current, as aforementioned. In such cases, the sensor may be also attached to parts of the human body.

The wearable device 805 also comprises a power source 815 designed provide the power for the wearable device 805, as aforementioned. The wearable device 805 also comprises a wireless transmitter configured to transmit signals to a remote receiver (not shown) and/or a remote power switch (not shown). The wearable device 805 also comprises a mechanism 820 designed for detecting electric shocks on a person. The mechanism 820 can comprise Bipolar transistor sets (not shown) designed to receive electric current from the sensor 835A and/or sensor 835B and activate the wireless transmitter 810, as aforementioned.

While the disclosure has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the disclosed subject matter not be limited to the particular embodiment disclosed as the best mode contemplated for carrying out this invention, but only by the claims that follow.

The invention claimed is:

1. A device for protecting individuals from electric shocks, comprising:
   a sensor designed to convey a flow of electric charge sensed on a human body;
   at least one wire configured to accept the flow of electric charge received from the sensor and convey the flow of electric charge to at least one bipolar junction transistor set, wherein the at least one bipolar junction transistor set is connected to a power circuit comprising an illumination source connected to a power source, wherein the at least one bipolar junction transistor set is functioning as a switch designed to close the power circuit upon receiving a current of at least 0.1 microampere conveyed from the sensor, and wherein the power source is designed to illuminate the illumination source upon closing the power circuit by the at least one bipolar junction transistor set;
   an optocoupler coupled with a transmitter designed to transmit wireless signals, wherein the optocoupler is configured to detect light received from the light illumination, and upon detecting illumination received from the illumination source, the optocoupler activates the transmitter to send predefined signals to a receiver which indicate that a flow of electric charge sensed on the human body.

2. The device of claim 1, wherein the bipolar junction transistor set comprising at least one bipolar junction transistor.

3. The device of claim 2, wherein the at least one bipolar junction transistor is a Bipolar NPN transistor.

4. The device of claim 2, wherein the at least one bipolar junction transistor is a Bipolar PNP transistor.

5. The device of claim 1, is embedded in a strip designed to be wearable by a person.

6. The device of claim 1, wherein the predefined signals sent by the transmitter comprises commands which indicate that a flow of electric charge sensed on the human body.

7. The device of claim 1, wherein the predefined signals are sent to a receiver.

8. The device of claim 7, wherein the receiver is connected to a power switch.

9. The device of claim 8, wherein the receiver is designed to disconnect the power switch.

10. The device of claim 1, is further designed to be wearable on a human body.

11. The device of claim 1, wherein the optocoupler is functioning as a light dependent resistor.

12. The device of claim 1, wherein the at least one bipolar junction transistor set comprises at least two bipolar NPN junction transistors.

13. The device of claim 1, wherein the at least one bipolar junction transistor set comprises at least two bipolar PNP junction transistors.

14. The device of claim 1, wherein the power source is a battery to which the illumination source is connected.

15. The device of claim 1, wherein the power source is embedded with the device to which the illumination source is connected.

16. A method for protecting individuals from electric shocks wherein the method is operable on a device comprising
   (i) a sensor designed to convey a flow of electric charge sensed on a human body,
   (ii) at least one wire configured to accept the flow of electric charge received from the sensor and convey the flow of electric charge to at least one bipolar junction transistor set, wherein the at least one bipolar junction transistor set is connected a power circuit comprising an illumination source connected to a power source, wherein the at least one bipolar junction transistor set is functioning as a switch designed to close the power circuit upon receiving a current of at least 0.1 microampere conveyed from the sensor, and wherein the power source is designed to illuminate the illumination source upon closing the power circuit by the at least one bipolar junction transistor set,
   (iii) an optocoupler coupled with a transmitter designed to transmit wireless signals, wherein the optocoupler is configured to detect light received from the illumination source, and upon detecting light received from the illumination source, the optocoupler activates the transmitter to send predefined signals which indicate that a flow of electric charge sensed on the human body; and
   wherein the method comprises:
   sensing a flow of electric charge sensed on a human body, by the sensor;
   conveying the flow of electric charge to the at least one bipolar junction transistor set;
   closing the power circuit and thereby allowing a flow of electric charge to flow from the power source and thereby illuminating the illumination source;
   detecting an illumination illuminated by the illumination source, by the optocoupler;
   activating the transmitter by the optocoupler upon receiving the illumination from the illumination source,
   sending by the transmitter predefined signals upon activating, wherein the predefined signals indicate that a flow of electric charge sensed on the human body, and wherein the predefined signals are sent to a receiver.

17. The method of claim 16, wherein the predefined signals sent by the transmitter comprises commands which indicate that a flow of electric charge sensed on the human body.

18. The method of claim 16, wherein the receiver is connected to a power switch.

19. The method of claim 16, wherein the receiver is designed to disconnect the power switch.

20. The method of claim 16, wherein the optocoupler is functioning as a light dependent resistor.

21. The method of claim 16, wherein the power source is a battery to which the illumination source is connected.

22. The method of claim 16, wherein the power source is embedded with the device to which the illumination source is connected.

* * * * *